United States Patent [19]
Ohta

[11] Patent Number: 5,978,948
[45] Date of Patent: Nov. 2, 1999

[54] SEMICONDUCTOR CIRCUIT SYSTEM, METHOD FOR TESTING SEMICONDUCTOR INTEGRATED CIRCUITS, AND METHOD FOR GENERATING A TEST SEQUENCE FOR TESTING THEREOF

[75] Inventor: Mitsuyasu Ohta, Osaka, Japan

[73] Assignee: Matsushita Electric Industrial Co., Ltd.

[21] Appl. No.: 08/888,920

[22] Filed: Jul. 7, 1997

[30] Foreign Application Priority Data

Jul. 5, 1996 [JP] Japan ................................. 8-175304

[51] Int. Cl.[6] .................................................. G11C 31/28
[52] U.S. Cl. ............................................. 714/736; 714/724
[58] Field of Search .................................... 714/736, 724, 714/733, 734, 735, 738, 745; 324/158.1; 365/201

[56] References Cited

U.S. PATENT DOCUMENTS

| 4,692,921 | 9/1987 | Dahbura et al. ........................ 371/27.1 |
| 5,012,185 | 4/1991 | Ohfuji ................................... 324/158 R |
| 5,412,258 | 5/1995 | Ogawa et al. ........................... 327/170 |
| 5,412,315 | 5/1995 | Tsuda .................................... 324/158.1 |
| 5,420,869 | 5/1995 | Hatakeyama ........................... 371/21.1 |
| 5,710,778 | 1/1998 | Bettman et al. ........................ 371/22.2 |
| 5,787,093 | 7/1998 | Fujisaka ................................. 371/27.1 |

FOREIGN PATENT DOCUMENTS 6-334010 12/1994 Japan .
7-38417 2/1995 Japan .

*Primary Examiner*—Hoa T. Nguyen
*Attorney, Agent, or Firm*—McDermott, Will & Emery

[57] ABSTRACT

Logic blocks are placed between a power supply terminal and a grounding terminal. Each logic block has a logic circuit in which low-threshold voltage transistors are arranged, and high-threshold voltage transistors, pHVth- and nHVth-Tr's, are placed between each terminal and the logic circuit. At the time of receiving a test signal Sdt to perform testing of wiring arranged outside the logic circuit, and HVth-Tr's, a state control unit controls each HVth-Tr to turn off and an electric current at each terminal is measured, which makes it possible to detect faulty products resulting from the malfunction of HVth-Tr's and the short-circuiting of wires. It is possible to perform failure detection with making a distinction between failure occurring in the logic circuit and failure occurring outside the logic circuit.

14 Claims, 14 Drawing Sheets

SEMICONDUCTOR CIRCUIT SYSTEM, METHOD FOR TESTING SEMICONDUCTOR INTEGRATED CIRCUITS, AND METHOD FOR GENERATING A TEST SEQUENCE FOR TESTING THEREOF

BACKGROUND OF THE INVENTION

The present invention relates to a multi-threshold (MT) CMOS semiconductor circuit system that contains therein semiconductor integrated circuits with MOS transistors having different threshold voltages, to a method for testing semiconductor integrated circuits, and to a method for generating test sequences for testing of semiconductor integrated circuits.

As the dimensions of semiconductor devices are reduced and the level of integration of semiconductor devices is improved, there have been strong demands for low-power semiconductor integrated circuits. The reduction of power supply voltage is an effective way of implementing semiconductor integrated circuits with low power dissipation. The problem is that a reduction in power supply voltage results in slow transistors. A solution to this problem has been proposed. An MT-CMOS semiconductor integrated circuit, as one of semiconductor integrated circuits formed by CMOS semiconductor devices, has been known in the art. In the MT-CMOS semiconductor integrated circuit, two types of MOS transistors are employed, namely low-threshold voltage MOS transistors (low-threshold MOS transistors) and high-threshold voltage MOS transistors (high-threshold MOS transistors).

An MT-CMOS semiconductor integrated circuit is reported in TECHNICAL REPORT OF IEICE, ICD93-107 (1993-10) of THE INSTITUTE OF ELECTRONICS, INFORMATION AND COMMUNICATION ENGINEERS, which is described with reference to FIG. 13.

FIG. 13 is a circuit diagram which outlines a part of the MT-CMOS semiconductor integrated circuit. FIG. 13 shows that logic gate 99, in which low-threshold transistors (LVth-Tr's) are placed, is connected between power supply terminal 100 at which the operation voltage (VDD) is provided and grounding terminal 101 at which the grounding potential (VGN) is provided. Connected between power supply terminal 100 and logic gate 99 is a p-channel, high-threshold transistor (pHVth-Tr 91). Further, connected between logic gate 99 and grounding terminal 101 is an n-channel, high-threshold transistor (nHVth-Tr 92). Transistors 93–96, contained in logic gate 99, are low-threshold transistors, therefore having the ability to operate at high speed and perform arithmetic operations at high speed, but on the other hand, a large leakage current will flow therein. This may lead to an increase in power consumption. To cope with this problem, HVth-Tr 91 is placed between logic gate 99 and terminal 100 and HVth-Tr 92 is placed between logic gate 99 and terminal 101.

The operation of the MT-CMOS semiconductor integrated circuit of FIG. 13 is described. The electric potential of node 97 between logic gate 99 and pHVth-Tr 91 is the virtual power supply potential (VDDV), while the electric potential of node 98 between logic gate 99 and nHVth-Tr 92 is the virtual grounding potential (VGNV). Electric charges are applied to node 97 that acts as a virtual power supply terminal and to node 98 that acts as a virtual grounding terminal by having HVth-Tr 91 and HVth-Tr 92 placed in the ON state during the operation period of logic gate 99, whereby logic gate 99 formed of LVth-Tr's 93–96 starts operating at high speed. On the other hand, the supply of voltage from terminal 100 to logic gate 99 is cut off by having HVth-Tr 91 placed in the OFF state during the standby period, and HVth-Tr 92 turns off thereby suppressing the leakage current from logic gate 99 to terminal 101 during the standby period. As a result, leakage from terminal 100 to terminal 101 can be held considerably low.

The above-described MT-CMOS semiconductor integrated circuit, however, suffers some problems. For example, when a transistor failure occurs in the MT-CMOS semiconductor integrated circuit, the following inconvenience may occur. Suppose that both HVth-Tr 91 and HVth-Tr 92 fail, for some trouble, to go into the OFF state. Even in such a case, logic gate 99 operates normally, for both HVth-Tr 91 and HVth-Tr 92 are in the ON state when there is an operation command for logic gate 99. On the other hand, when there is a standby command for logic gate 99, both HVth-Tr 91 and HVth-Tr 92 continue to stay in the ON state. In other words, even when trouble causes both HVth-Tr 91 and HVth-Tr 92 to fail to turn off, all the elements of logic gate 99 operate normally thereby producing no ill-effects on the operation of logic gate 99. However, if HVth-Tr 91 and HVth-Tr 92 fail to turn off during the standby period, this results in an increase in the leakage current that flows, via logic gate 99, from power supply terminal 100 to grounding terminal 101. Such an increase makes no sense to the provision of the HVth-Tr's. Accordingly, it becomes impossible to enjoy the foregoing advantages of the MT-CMOS semiconductor integrated circuit, that is, high-speed operations and low power dissipation.

For the case of commonly-used MT-CMOS semiconductor integrated circuits, it is impossible to detect a failure causing HVth-Tr's 91 and 92 to fail to turn off in response to a standby command, as a result of which an increase in the leak-off current cannot be prevented effectively.

The foregoing problems are caused not only by the malfunction of high-threshold transistors but also by the occurrence of short-circuit between a member (e.g., a connection line between the power supply terminal and the logic gate, and an element), or between a member (e.g., a connection line between the logic gate and the grounding terminal, and an element).

SUMMARY OF THE INVENTION

The conventional MT-CMOS semiconductor integrated circuit suffers the above-described problem because there is provided no means having the ability to perform failure detection with making a distinction between failure occurring in the logic circuit and failure occurring outside the logic circuit caused by the malfunction of HVth-Tr's and the short-circuit of wires. Bearing in mind such a problem, the present invention was made. Accordingly, it is a first object of the present invention to provide a semiconductor circuit system including a high-speed, low-power MT-CMOS semiconductor integrated circuit, and a method for testing a semiconductor integrated circuit, by providing a means capable of perform failure detection with making a distinction between failure occurring in the logic circuit and failure occurring outside the logic circuit.

The target of a conventional system that automatically generates a test sequence for use in the testing of logical failures in signal lines is failures in an output or an input line of a logic gate in a conventional CMOS semiconductor integrated circuit. Accordingly, even in determining whether a logic circuit is accepted or rejected with such a conventional system, it is impossible to make a distinction between the state in which HVth-Tr is to operate and the state in which HVth-Tr is not to operate. A conventional test-sequence generating system cannot automatically generate a test sequence for a logic circuit.

It is a second object of the present invention to provide a test-sequence generating method for an MT-CMOS semiconductor integrated circuit, the method being capable of automatically generating a test sequence for testing of the inside of logic circuits while making utilization of a conventional CMOS semiconductor integrated circuit testing method.

In order to achieve the first object, the present invention provides a means capable of controlling the ON/OFF state of HVth-Tr's according to the type of test signal.

The present invention provides a semiconductor circuit system having, on the inside or outside of a semiconductor integrated circuit of said semiconductor circuit system, test command means for issuing a command to perform testing for determining whether said semiconductor integrated circuit is accepted or rejected, said semiconductor integrated circuit comprising:

(a) a first terminal which supplies a voltage at high potential;

(b) a second terminal which supplies a voltage at low potential;

(c) at least one logic circuit which is connected between said first terminal and said second terminal and which is formed of a placement of a plurality of low-threshold voltage transistors;

(d) a high-threshold voltage transistor which is connected between at least one of said first and second terminals and said logic circuit and which switches between the ON state and the OFF state thereby to have said logic circuit switched between the operating state and the standby state;

(e) wiring which is arranged outside said logic circuit to establish connections among said first terminal, said second terminal, said logic circuit, and said high-threshold voltage transistor; and (f) a state control unit which receives a test commands from said test command means to control the ON/OFF state of said high-threshold voltage transistor according to the type of said received test command.

As a result of such arrangement, it becomes possible to investigate an electric current and a logic circuit's operating state when the high-threshold transistors of the MT-CMOS semiconductor circuit system turn on or off, which makes it possible to perform failure detection with making a distinction between failure in the logic circuit and failure outside the logic circuit due to a short circuit of wires outside the logic circuit or the malfunction of HVth-Tr.

It is preferred in the semiconductor circuit system that, at the time of receiving from said test command means a test command to perform testing of said wiring and said high-threshold voltage transistor, said state control unit controls said high-threshold voltage transistor to go into the OFF state.

Accordingly, it is possible to determine, by investigating an electric current flowing in a path between the first terminal and the second terminal, whether power is consumed unnecessarily due to a short-circuit of external wires or the malfunction of HVth-Tr's, when the wire and HVth-Tr are tested. By removal of semiconductor integrated circuits that use electric power unnecessarily, it becomes possible to counterbalance the disadvantage of LVth-Tr (i.e., the large leakage current that flows during the OFF state) while at the same time securing high-speed operations in a logic circuit formed of LVth-Tr's, in other words it is possible to secure the function of MT-CMOS semiconductor integrated circuits formed of low-threshold transistors and high-threshold transistors.

It is preferred in the semiconductor circuit system that:

(a) a plurality of said logic circuits are provided;

(b) said first and second terminals are made common to all of said logic circuits; and (c) said state control unit controls said high-threshold voltage transistors coupled to all of said logic circuits to go into the OFF state.

It is preferred in the semiconductor circuit system that:

(a) a plurality of said logic circuits are provided;

(b) said first and second terminals are made common for every one or more logic circuits of said logic circuits; and (c) at the time of receiving from said test command means a test command to perform testing of said wiring and said high-threshold voltage transistors, said state control unit controls said high-threshold voltage transistors, which are coupled to said logic circuits connected between said first terminal and said second terminals, to go into the OFF state.

As a result of such arrangement, even when the placement of the first (second) terminal and the logic circuit changes depending on, for example, the type of voltage or the type of logic circuit, the foregoing operation can be obtained.

It is preferred in the semiconductor circuit system that said high-threshold transistor is connected between said first terminal and said logic circuit and between said second terminal and said logic circuit.

Such arrangement makes it possible to determine whether a logic circuit is disconnected from both higher and lower voltages. The disadvantage that power is consumed unnecessarily can be overcome.

It is preferred that the semiconductor circuit system further comprises:

(a) electric current detecting means for detecting the value of an electric current which flows between said first terminal and said second terminal;

(b) storage means for pre-storing a set value which is referred to in making a judgement of acceptance or rejection as to said detected electric current value;

(c) judging means, coupled to said electric current detecting means and to said storage means, for making a judgement of rejection when said detected electric current value exceeds said set value, and for making a judgement of acceptance when said detected electric current value is less than said set value; and (d) display means for displaying a result of said judgement made by said judging means.

Such an arrangement makes it possible to provide a test device capable of fast detection of the malfunction of high-threshold transistors of an MT-CMOS semiconductor integrated circuit and the short-circuiting of wires outside the logic circuits.

It is preferred in the semiconductor circuit system that, when said state control unit receives from said test command means a test command to perform testing of the inside of said logic circuits, said state control unit controls a high-threshold voltage transistor, coupled to a logic circuit of said logic circuits that is a target of testing, to go into the ON state.

Such an arrangement makes it possible to test whether the operation of logic circuits is acceptable or unacceptable, with high-threshold transistors placed in the ON state.

It is preferred that the semiconductor circuit system further comprises:

(a) means for applying a test signal into said logic circuit;

(b) expected value storing means for pre-storing an expected value for a logic value which is provided when said logic circuit is accepted, with respect to said test signal;

(c) judging means, coupled to said expected value storing means, for making a comparison between the logic value of an output signal from said logic circuit and said expected value, for making a judgement of acceptance when said logic value and said expected value agree, and for making a judgement of rejection when said values disagree; and (d) displaying means for displaying a result of said judgement.

The present invention provides a method for testing a semiconductor integrated circuit comprising a first terminal for supplying a voltage at high potential, a second terminal for supplying a voltage at low potential, at least one logic circuit connected between said first terminal and second terminal and formed of a placement of a plurality of low-threshold voltage transistors, a high-threshold voltage transistor which is connected between at least one of said first and second terminals and said logic circuit and which switches between the ON state and the OFF state thereby to have said logic circuit switched between the operating state and the standby state, and wiring which is arranged outside said logic circuit to establish connections among said first terminal, said second terminal, said logic circuit, and said high-threshold voltage transistor;

said method comprising the steps of:

(a) a first step of placing said high-threshold voltage transistor into the OFF state;

(b) a second step of detecting the value of an electric current flowing between said first terminal and said second terminal; and (c) a third step of making a judgement of rejection when said detected value exceeds a predetermined set value and of making a judgement of acceptance when said detected value is less than said predetermined set value.

Accordingly, it becomes possible to get rid of an unacceptable semiconductor integrated circuit in which an unnecessary electric current occurs due to the malfunction of high-threshold transistors or the short-circuiting of wires outside the logic circuits. Only MT-CMOS semiconductor integrated circuits having good characteristics are chosen.

In order to achieve the second object, the present invention provides a means. More specifically, descriptions about the state of wires for supplying power supply voltage are added in addition to conventional test sequences.

The present invention provides a method of generating a test sequence for a semiconductor integrated circuit comprising a first terminal for supplying a voltage at high potential, a second terminal for supplying a voltage at low potential, at least one logic circuit connected between said first terminal and second terminal and formed of a placement of many elements including a plurality of low-threshold voltage transistors, a high-threshold voltage transistor which is connected between at least one of said first and second terminals and said logic circuit and which switches between the ON state and the OFF state thereby to have said logic circuit switched between the operating state and the standby state, wiring which is arranged outside said logic circuit to establish connections among said first terminal, said second terminal, said logic circuit, and said high-threshold voltage transistor, and a state control unit which provides a control signal to control the ON/OFF state of said high-threshold voltage transistor;

said method comprising the steps of:

(a) a first step of creating a partial circuit description about the state of connections among elements of a logic circuit of said logic circuits that is a target of testing;

(b) a second step of creating a test sequence composed of a description as to an input/output relationship for determining whether said test-target logic circuit operates normally on the basis of said partial circuit description created in said first step; and (c) a third step of creating a new sequence capable of placing said control signal from said state control unit in such a mode that said high-threshold transistor which is coupled to said test-target logic circuit enters the ON state, and adding said new sequence to said test sequence created in said second step.

As a result of such arrangement, only by adding a new sequence to a conventionally generated test sequence, it becomes possible to generate a test sequence applicable in checking the operation of a logic circuit of the MT-CMOS integrated circuit.

It is preferred in the method of generating a test sequence for a semiconductor integrated circuit that:

(a) said high-threshold transistor coupled to said test-target logic circuit is formed so as to go into the ON state according to a control signal applied from outside at the time of testing said logic circuit; and (b) in said third step a new sequence capable of placing said external control signal in such a mode that said test-target logic circuit enters the operable state is created and said new sequence is added to said test sequence created in said second step.

Such arrangement makes it possible to generate a test sequence for checking the operation of logic circuits of an MT-CMOS semiconductor integrated circuit with a configuration that is controlled directly by the external control signal.

PREFERRED EMBODIMENTS OF THE PRESENT INVENTION

FIRST EMBODIMENT

Figure 1:
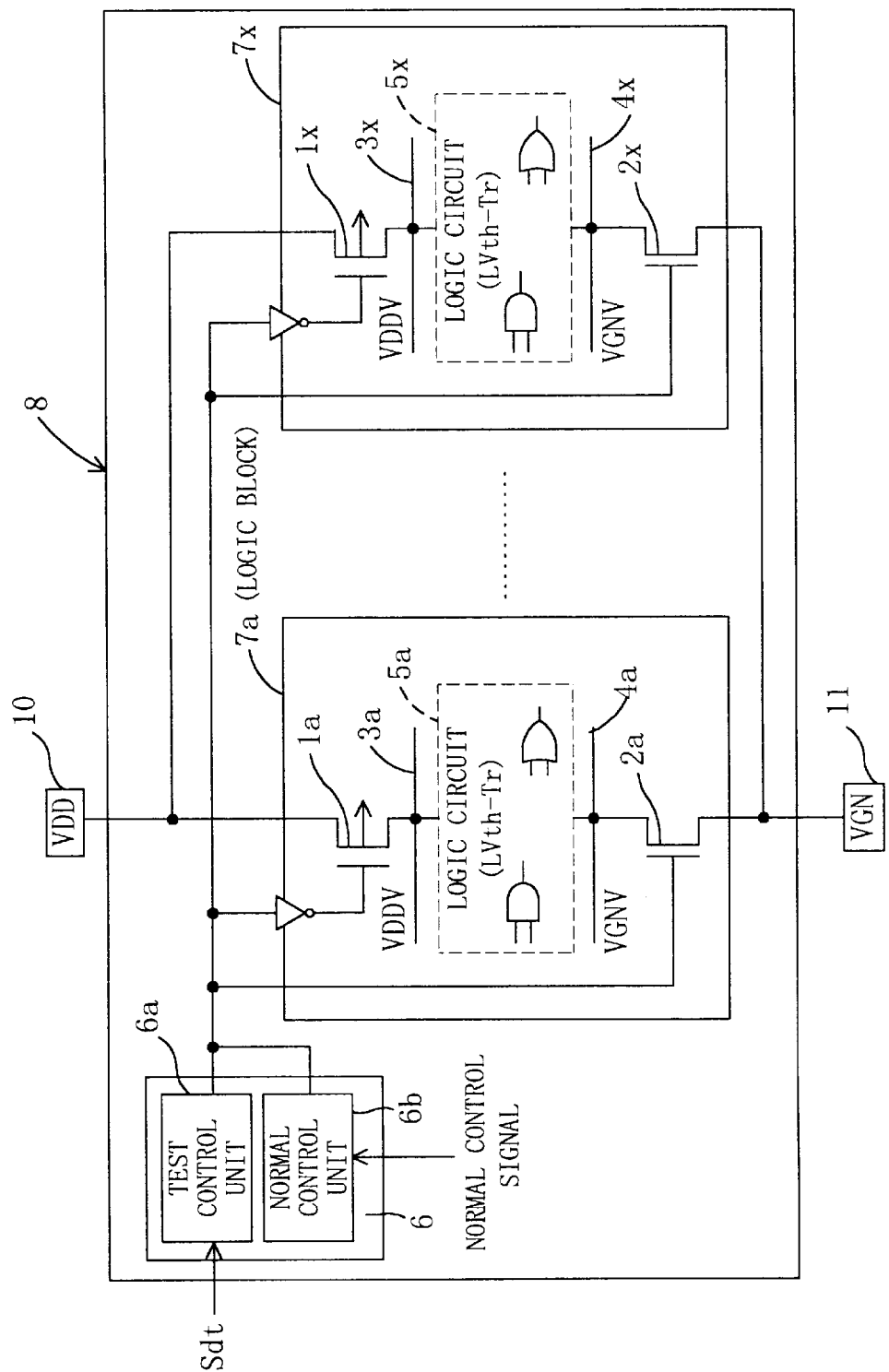
FIG. 1 is an electric circuit diagram of an MT-CMOS semiconductor integrated circuit in accordance with a first embodiment of the present invention.

A first embodiment of this invention is described. FIG. 1 is an electric circuit diagram of an MT-CMOS semiconductor circuit system of the first embodiment.

Semiconductor integrated circuit 8, shown in FIG. 1, has logic blocks 7a–7x formed of MT-CMOS semiconductor devices. Logic blocks 7a–x have logic circuits 5a–5x, respectively. Each logic circuit 5a–5x is formed of many low-threshold transistors (LVth-Tr's) and is connected between power supply terminal 10 at which VDD is provided and grounding terminal 11 at which VGN is provided. Connected between each of logic circuits 5a–5x and terminal 10 are p-channel, high-threshold transistors (pHVth-Tr's) 1a–1x. On the other hand, connected between each of logic circuits 5a–5x and terminal 11 are n-channel, high-threshold transistors (nHVth-Tr's) 2a–2x. The electric potential of first nodes 3a–3x between pHVth-Tr's 1a–1x and logic circuits 5a–5x is VDDV (the virtual power supply potential). On the other hand, the electric potential of second nodes 4a–4x between nHVth-Tr's 2a–2x and logic circuits 5a–5x is VGNV (the virtual grounding potential). Semiconductor integrated circuit 8 is provided with state control unit 6. State control unit 6 has test control unit 6a. In response to a test signal (Sdt) for testing components other than logic circuits 5a–5x, i.e., each HVth-Tr and wires, test control unit 6a disconnects logic circuits 5a–5x from terminals 10 and 11 and, as a result, logic circuits 5a–5x each enter the standby state. State control unit 6 further has normal control unit 6b. In response to a normal control signal applied from inside semiconductor integrated circuit 8, normal control unit 6b controls the operation of the low-threshold transistors of the logic blocks. In the present embodiment, power supply and grounding terminals 10 and 11 common to logic blocks 7a–7x are provided and, during the test period, test control unit 6a of state control unit 6 controls all of pHVth-Tr's 1a–1x and nHVth-Tr's 2a–2x in logic blocks 7a–7x to go into the OFF state at the same time. According to the normal control signal, each HVth-Tr is controlled, by normal control unit 6b, to turn on during the operation period of logic blocks 7a–7x or to turn off during the standby period.

A technique of testing semiconductor integrated circuit 8 having the above-described organization is now described with reference to FIGS. 2 and 3.

Figure 2:
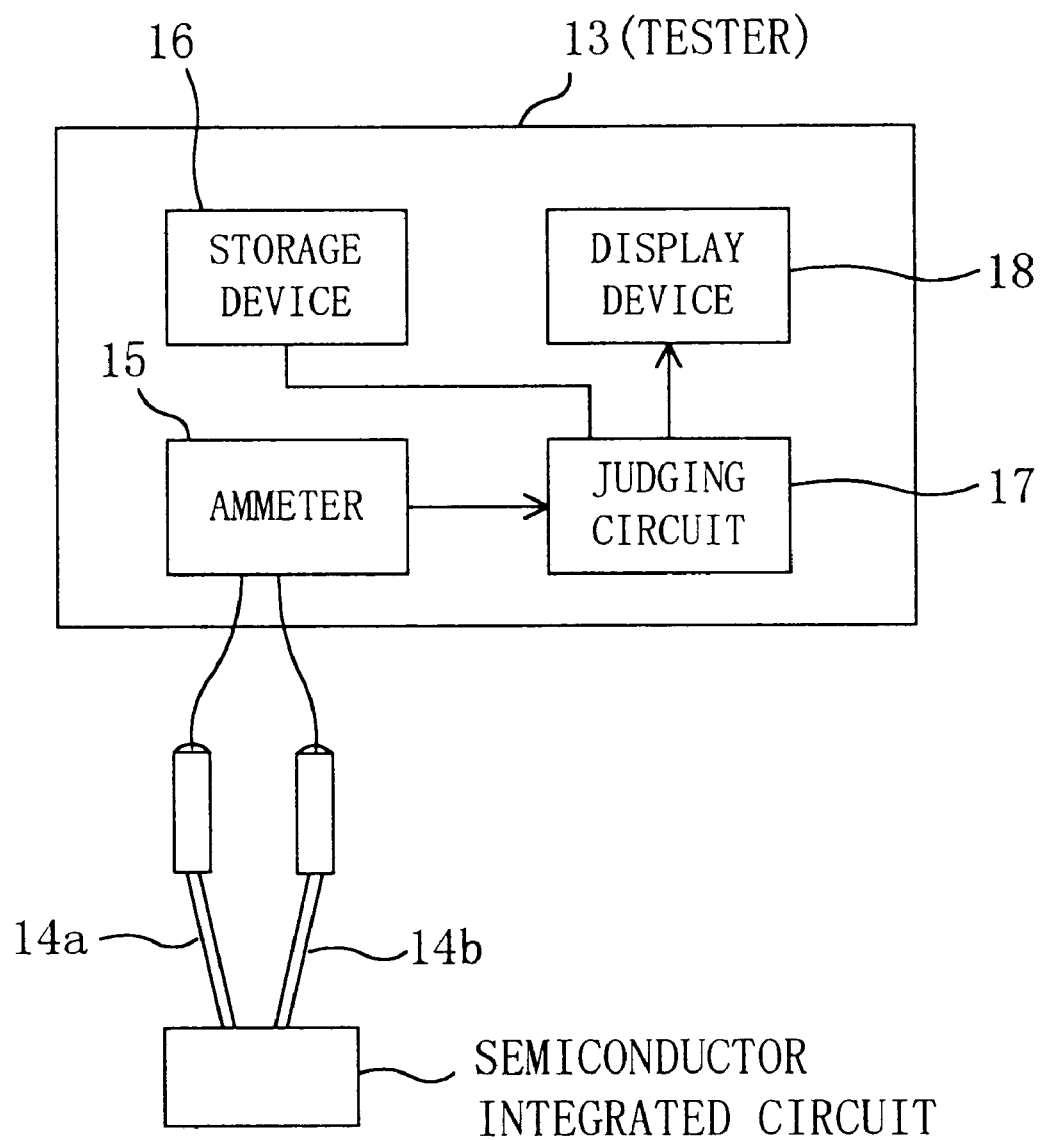
FIG. 2 outlines in block form an organization of a test device of the first embodiment.

FIG. 2 outlines in block form the organization of tester 13 for testing semiconductor integrated circuits. As shown in the figure, tester 13 has probes 14a and 14b which are brought into contact with both ends of a part of semiconductor integrated circuit 8, ammeter 15 that is connected to probes 14a and 14b, storage device 16 which stores a predetermined set value, judgement circuit 17 which determines whether a target of testing is acceptable or unacceptable, and display device 18 which receives a signal indicative of a judgement result from judgement circuit 17 and displays the result. At the time of testing semiconductor integrated circuit 8, probes 14a and 14b are brought into contact with a location defined between terminals 10 and 11, to detect, for example, an HVth-Tr failure.

Figure 3:
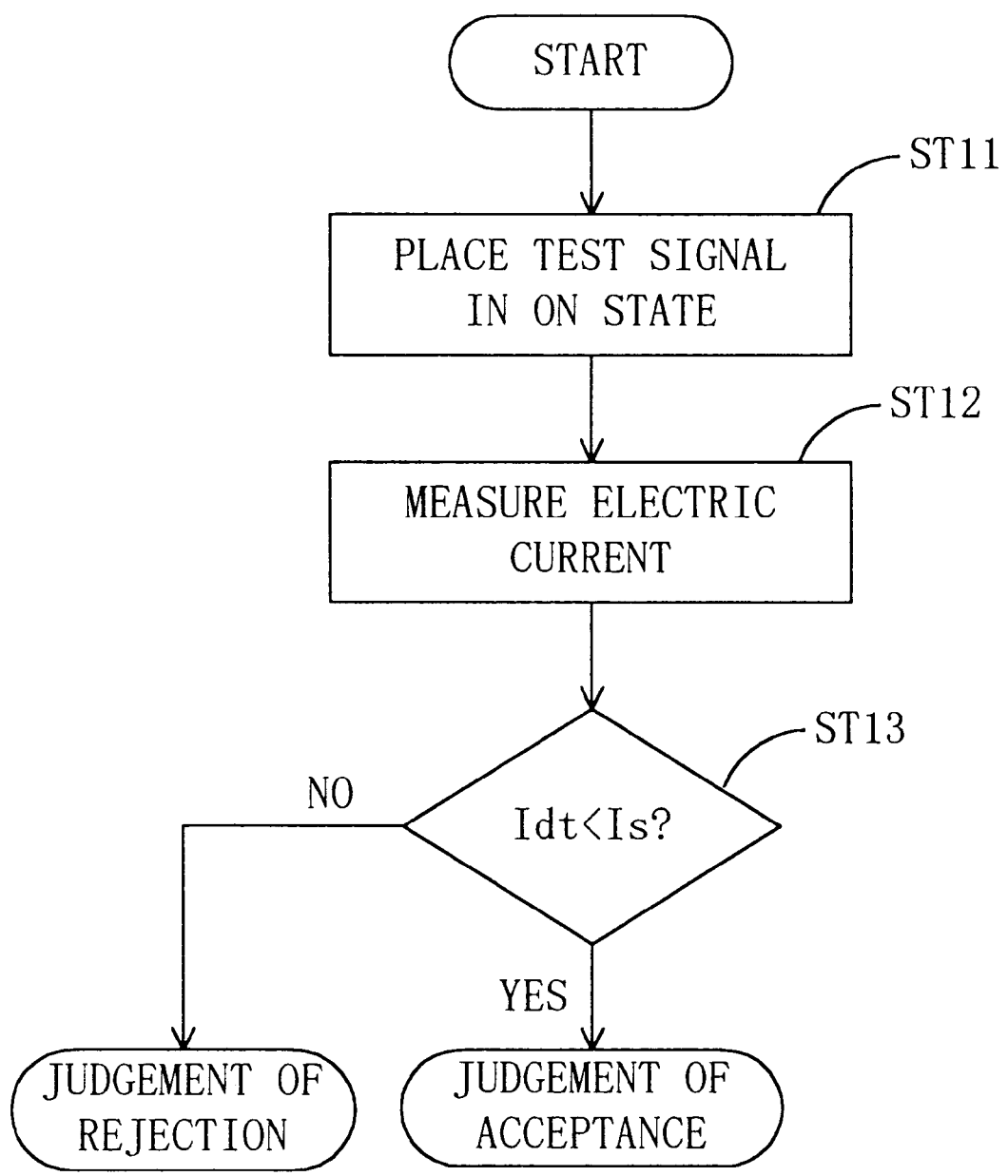
FIG. 3 is a flow chart showing a test procedure of the first embodiment.

FIG. 3 is a flow chart showing a test procedure of the present embodiment. In step ST11, when the test signal Sdt goes into the ON state, pHVth-Tr's 1a–1x and nHVth Tr's 2a–2x of logic blocks 7a–7x are controlled by test control unit 6a to turn off. If pHVth-Tr's 1a–1x and nHVth Tr's 2a–2x enter the OFF state in normal manner, this have logic circuits 5a–5x placed in the standby state, in other words logic circuits 5a–5x are disconnected from power supply and grounding terminals 10 and 11.

In step ST12, an electric current flowing in a path is measured. Such measurement may be carried out at the side of power supply terminal 10 or at the side of grounding terminal 11.

In step ST13, a check is made to determine whether Idt (the detected value of a leakage current when signal Sdt is in the OFF state) is below Is (the predetermined set value). If Idt is less than Is, this means "accepted". If Idt is equal to or greater than Is, this means "rejected". The set value, Is, is given by:

$$Is=I+K1$$

where I is the electric current that flows under normal conditions and K1 is the constant allowing for characteristic variations occurring in the fabrication. The set value, Is, is stored in storage device 16.

In accordance with the present embodiment, it is possible to determine whether a logic block in the MT-CMOS semiconductor integrated circuit makes a transition to the standby state during the test period, in other words it is possible to effectively detect a faulty product that fails to operate normally due to the malfunction of high-threshold transistors or due to the short-circuiting of wires of the MT-CMOS semiconductor integrated circuit. Wire short-circuit that is detected by the present test is wire short-circuit occurring outside logic circuits 7a–7x, such as a short-circuit occurring between source terminals of pHVth- and nHVth-Tr's connected to the same logic circuit (for example, pHVth-Tr 1a and nHVth-Tr 2a connected to logic circuit 7a), and a short-circuit occurring between the source and drain of an HVth-Tr when the HVth-Tr's are provided at one side only.

In this way, faulty products are screened and only MT-CMOS semiconductor integrated circuits free from defects are selected and shipped from the factory.

The present embodiment has been described in terms of an MT-CMOS semiconductor integrated circuit including a plurality of logic blocks formed of MT-CMOS semiconductor devices. The present invention may be embodied in an MT-CMOS semiconductor integrated circuit including only one logic block formed of MT-CMOS semiconductor devices.

In accordance with the present embodiment, state control unit 6 is placed outside logic blocks 7a–7x. State control unit 6 may be placed in each logic block 7a–7x.

In accordance with the present embodiment, it Is designed such that the test signal Sdt is applied directly from outside semiconductor integrated circuit 8 to test control unit 6a of state control unit 6. The test signal Sdt may be generated within each logic block 7a–7x, and the same effects can be obtained. Further, in accordance with the present embodiment, the normal control signal is generated within semiconductor integrated circuit 8. The normal control signal may be applied from outside semiconductor integrated circuit 8, that is, from outside the semiconductor chip.

SECOND EMBODIMENT

Figure 4:
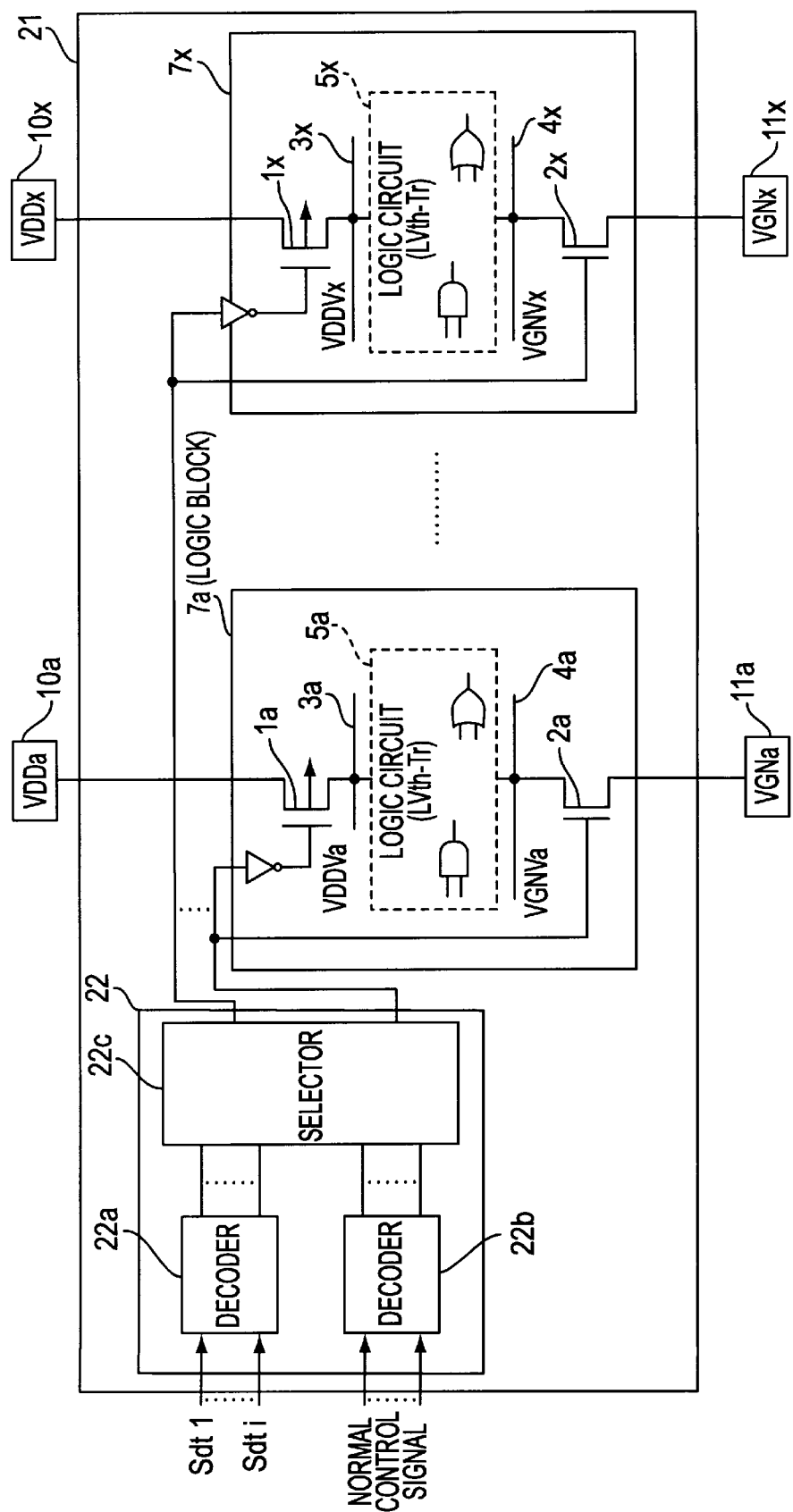
FIG. 4 is an electric circuit diagram of an MT-CMOS semiconductor integrated circuit in accordance with a second embodiment of the present invention.
Figure 5:
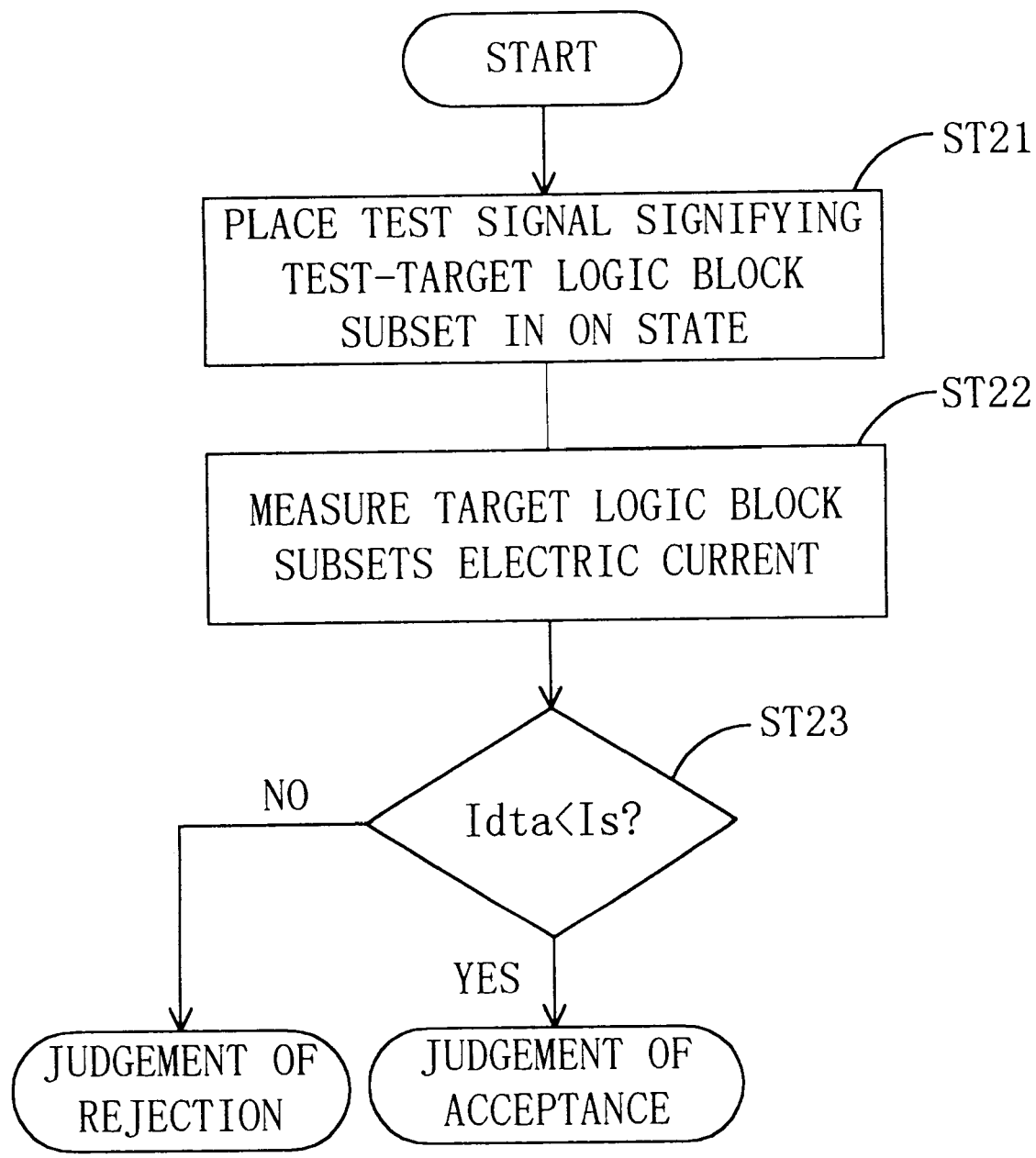
FIG. 5 is a flow chart showing a test procedure of the second embodiment.

A second embodiment of the present invention is now described by reference to FIGS. 4 and 5. FIG. 4 is an electric circuit diagram which outlines an organization of MT-CMOS semiconductor integrated circuit 21 according to the present embodiment. FIG. 5 is a flow chart showing a test procedure for semiconductor integrated circuit 21.

MT-CMOS semiconductor integrated circuit 21 has logic blocks 7a–7x formed of MT-CMOS semiconductor devices, and state control unit 22. State control unit 22 is described. Having received test signals Sdt1–Sdti, state control unit 22 controls pHVth- and nHVth-Tr's, which are contained in one or more logic blocks (hereinafter called a subset of logic blocks) of logic blocks 7a–7x subjected to testing, to turn off. State control unit 22 has decoder 22a which receives the test signals Sdt1–Sdti, decoder 22b which receives the normal control signals, and selector 22c which selects between the output from decoder 22a and the output from decoder 22b. According to a combination of Sdt1–Stdi, decoder 22a provides a signal that has pHVth- and nHVth-Tr's within a test-target logic block subset of logic blocks 7a–7x placed in the OFF state. Selector 22c selects, based on a mode switch signal indicative of test mode or normal control mode, between the test signal and the normal control signal. Selector 22c then provides a selection.

Logic blocks 7a–7x are provided with their respective power supply and grounding terminals 10a–10x and 11a–11x. It is to be noted that each logic block of the present embodiment is identical in internal organization with a corresponding one of the first embodiment.

The test apparatus of the present embodiment is basically identical in organization with that of the first embodiment shown in FIG. 2. The value of electric current is detected by bringing probes 14a and 14b of FIG. 2 into contact with, for example, external pins. The set value, Is, is given by:

$$Is = I + Kk$$

where Kk is the constant allowing for characteristic variations occurring in the fabrication. The electric potential of grounding terminals 11a–11x is assumed to be zero.

A test procedure is described with reference to the FIG. 5 flow chart.

In step ST21, a combination of test signals that signifies a test-target logic block subset, is fed to decoder 22a of state control unit 22. Suppose that logic block 7a is designated in the present embodiment. If either pHVth-Tr 1a or nHVth-Tr 2a operates normally, the target logic block subset 7a is disconnected from power supply terminal 10a or grounding terminal 11a to enter the standby state.

Next, in step ST22, Idta, which is the electric current value of logic block subset 7a, is measured at locations on the side of power supply terminal 10a or on the side of grounding terminal 11a.

Step ST23 determines whether the detected current value Idta is less than the set value Is. If Idta is determined to be less than Is, this means "accepted". On the other hand, if Idta is determined to be equal to or greater than Is, this means "rejected".

In the event that a different logic block subset, for example, logic block subset 7x, is designated to be a test-target logic block subset, the current value of logic block subset 7x is measured to determine whether pHVth-Tr 1x or nHVth-Tr 2x of logic block subset 7x operates normally, in other words whether the detected current value Idtx is less than the set value Is is determined. If Idtx is determined to be less than Is, this means "accepted". On the other hand, if Idtx is determined to be equal to or greater than Is, this means "rejected".

Like the first embodiment, it is possible for the present embodiment to determine whether an MT-CMOS semiconductor integrated is acceptable or not. Particularly, the present embodiment provides the advantage that, even when logic block subsets have different power supply voltages, it is still possible to determine, without fail, whether test-target logic block subsets are acceptable or unacceptable.

In the present embodiment, each of logic blocks 7a–7x formed of MT-CMOS semiconductor devices is provided with power supply terminal 10 and grounding terminal 11. However, power supply terminals 10 and grounding terminals 11 may be arranged to one logic block subset, for example, logic block subset 7a. Alternatively, a power supply and grounding terminals common between a plurality of logic blocks that belong in the same logic block subset may be provided, which achieves the same effects as the present embodiment.

In accordance with the present embodiment, state control unit 22 is arranged outside logic blocks 7a–7x. State control unit 22 may be formed within each logic block.

Further, in the present embodiment, it is arranged such that the test signals Sdt1–Sdti are fed to decoder 22a of state control unit 22 from outside semiconductor integrated circuit 8; however, these signals may be generated within logic blocks 7a–7x of semiconductor integrated circuit 8. Furthermore, in the present embodiment, the normal control signal is applied from outside semiconductor integrated circuit 8; however, the normal control signal may be generated outside semiconductor integrated circuit 8, that is, inside the semiconductor chip.

THIRD EMBODIMENT

Figure 6:
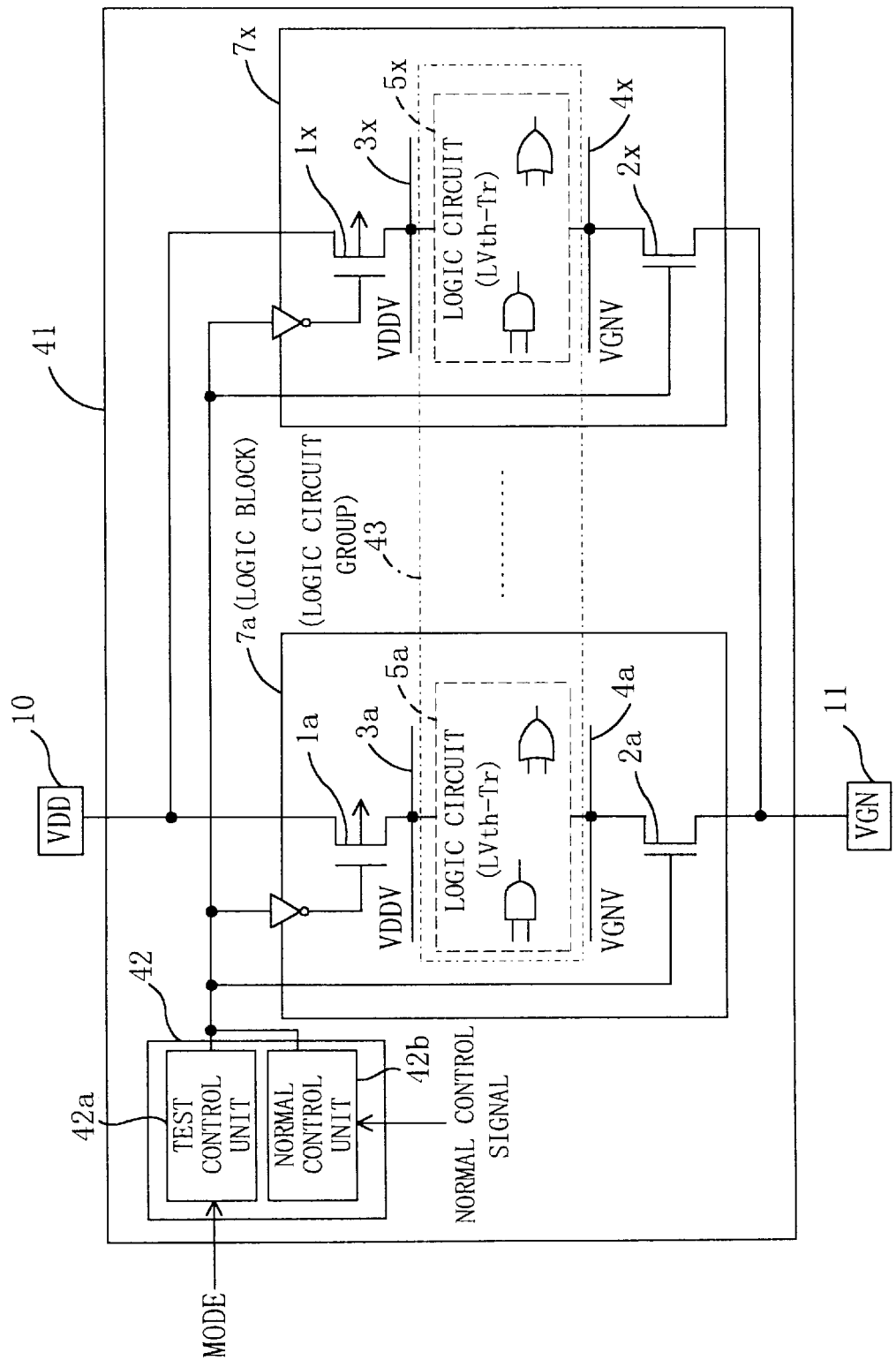
FIG. 6 is an electric circuit diagram of an MT-CMOS semiconductor integrated circuit in accordance with a third embodiment of the present invention.

A third embodiment of the present invention relates to a method for generating a test sequence for a semiconductor integrated circuit. FIG. 6 is an electric circuit diagram showing an organization of MT-CMOS integrated circuit 41 in accordance with the present embodiment.

Semiconductor integrated circuit 41 of the present embodiment has basically the same organization as semiconductor integrated circuit 8 of the first embodiment shown in FIG. 1. In the present embodiment, state control unit 42 is provided. State control unit 42 includes test control unit 42a. When the state control signal MODE is at "1" during the logic circuit test period, test control unit 42a controls the entirety of a logic circuit group 43, which is formed of logic circuits 5a–5x of logic blocks 7a–7x which is a target of testing, to connect with terminals 10 and 11 (the power supply terminal and the grounding terminals). In the present embodiment, when the state control signal MODE is at "1", this means that logic circuit group 43 is in the ON state. Like each of the foregoing embodiments, normal control unit 42b is arranged in state control unit 42 for controlling the normal operation of logic circuit group 43 according to the normal control signal.

Figure 7:
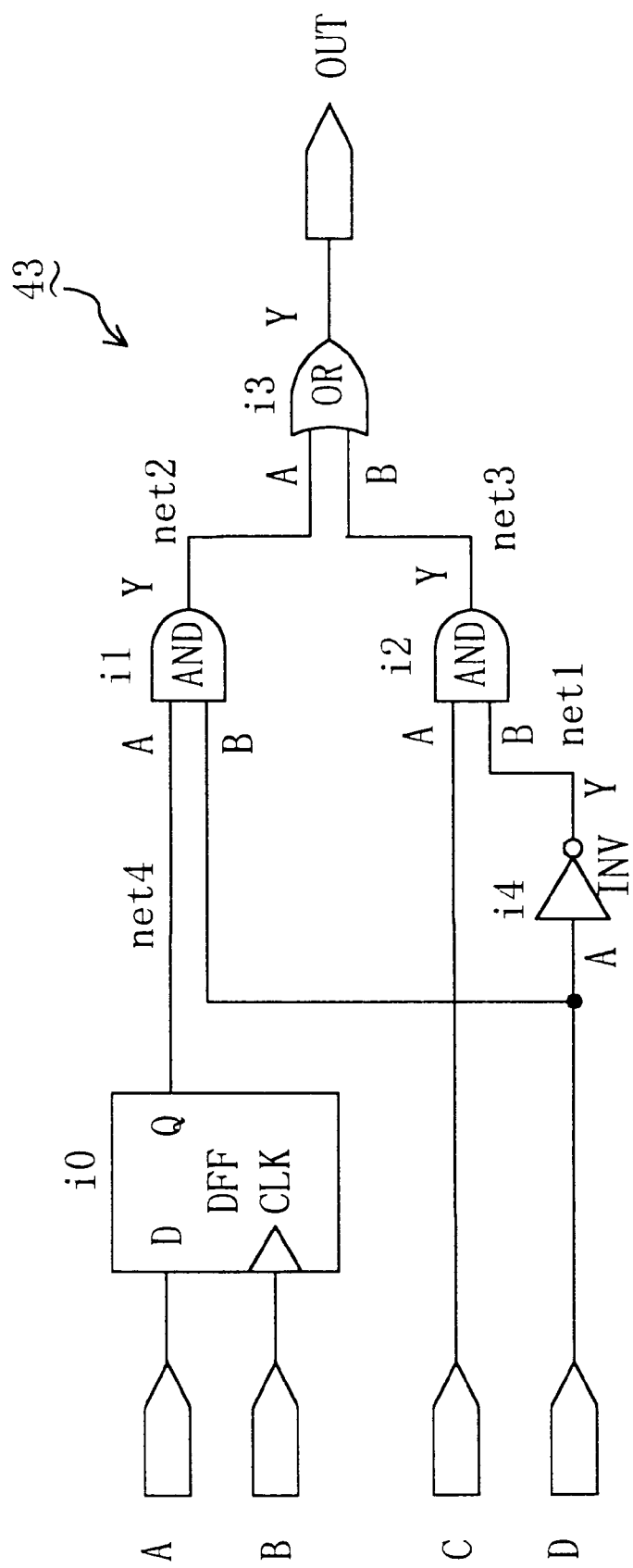
FIG. 7 shows in block form an organization of a group of logic circuits in the MT-CMOS semiconductor integrated circuit of the third embodiment.

FIG. 7 is a circuit diagram in block form showing an example of the organization of logic circuit group 43. Connected between input pins A–D and an output pin OUT are circuit elements including a flip-flop DFF, two AND circuits, an OR circuit, and an inverter INV. FIG. 7 shows identification names for the circuit elements, names for the input pins, a name for the output pin, and names for wire nets.

Figure 8:
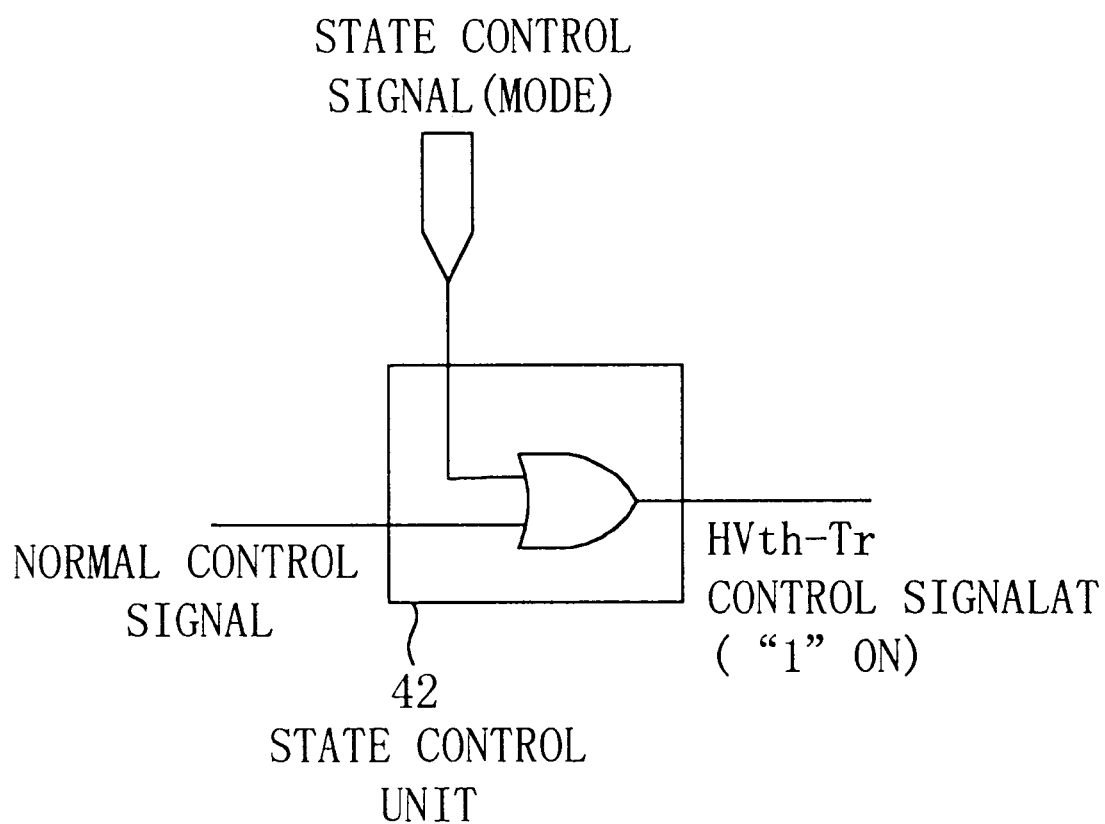
FIG. 8 shows in block form an organization of a state control unit of the MT-CMOS semiconductor integrated circuit of the third embodiment.

FIG. 8 is a block circuit diagram showing an organization of state control unit 42. State control unit 42 is formed of an OR circuit which receives the normal control signal and the state control signal (MODE) and generates the OR of these input signals. Each HVth-Tr is controlled to go into the ON state when state control unit 42 provides the HVth-Tr control signal at "1". In other words, the function of test control unit 42a and the function of normal control unit 42b (see FIG. 6) are incorporated into the OR circuit.

The functions of test control unit 6a and normal control unit 6b (see FIG. 1) may be implemented by an organization shown in FIG. 8, that is, by a single OR circuit.

A method of generating a test sequence for the above-described semiconductor integrated circuit is illustrated with reference to a flow chart shown in FIG. 9.

In step ST31, a netlist, shown in TABLE 1, is created to be circuit descriptions for logic circuit group 43, a target of testing.

TABLE 1

```
module sample1(A,B,C,D,OUT)
input           A,B,C,D;
output          OUT;
wire            net1,net2,net3,net4;
DFF             i0(.D(A),.CLK(B),.Q(net4)
AND             i1(.A(net4),.B(D),.Y(net2);
AND             i2(.A(C),.B(net1),.Y(net3);
OR              i3(.A(net2),.B(net3),.Y(OUT);
INV             i4(.A(D),.Y(net1);
```

Here, "sample1" is the logic circuit name. "input" indicates the external Input pins A–D. "output" indicates the external output pin OUT. "wire" declares that each net1–net4 is a wire net between each cell. "DFF" "AND", "OR", and "INV" are cell names entered in the library, and "i0" to "i4" are instance names for cell identification. "net1" to "net4" each represent a wire net between each cell. For example, a description for "AND" of Table 1 shows that the input pin A, input pin B and output pin Y of the element i1 (an AND element (AND) entered in the library) are connected to the wire net net4, to the external input pin D, and to the wire net net2, respectively.

Circuit descriptions for a semiconductor integrated circuit formed of conventional CMOS semiconductor devices, include information about the propagation of signals between each element; however, it does not include information about the supply of electric power to respective elements. The reason is that, since a high-threshold transistor for establishing a disconnection between the power supply and the logic circuit is not provided, the supply of power is a precondition. Also in the present embodiment, if it is assumed that power is supplied to each logic circuit 5a–5x of logic circuit group 43 formed of low-threshold transistors which is a target of testing, logic circuit group 43 can be taken as a conventional CMOS circuit, during the test period. Accordingly, logic circuit group 43 can be described as the foregoing netlist.

In step ST32, a test sequence for the netlist created in step ST31 is generated using the same means as used for conventional CMOS semiconductor integrated circuits. Table 2 shows a test sequence which is generated by making use of a technique for testing conventional CMOS semiconductor integrated circuits, assuming the Table 1 circuit description, for detecting the "0" degeneracy failure of the Q output of the flip-flop DFF.

TABLE 2

| A | B | C | D | OUT |
|---|---|---|---|-----|
| 1 | 0 | 0 | 1 | X   |
| 1 | 1 | 0 | 1 | H   |

In Table 1, "0" and "1" each indicate an input signal, "H" indicates that the expected value is "1", and "X" means "don't care".

Next, in step ST33, a test sequence for controlling the state control unit is added to the test sequence of Table 2 generated in step ST32. Table 3 shows a test sequence resulting from adding to the Table 2 test sequence a new sequence about the state control signal MODE.

TABLE 3

| A | B | C | D | OUT | MODE |
|---|---|---|---|-----|------|
| 1 | 0 | 0 | 1 | X   | 1    |
| 1 | 1 | 0 | 1 | H   | 1    |

Referring to Table 3, a signal is provided which controls each HVth-Tr to go into the ON state when the state control signal MODE is at "1". Logic circuit group 43 is tested. More specifically, in this case, the Q output of the flip-flop DFF is tested for the presence or absence of a degeneracy failure.

In this way, a test sequence for MT-CMOS semiconductor integrated circuits can be generated by making use of a conventional method.

Figure 14:
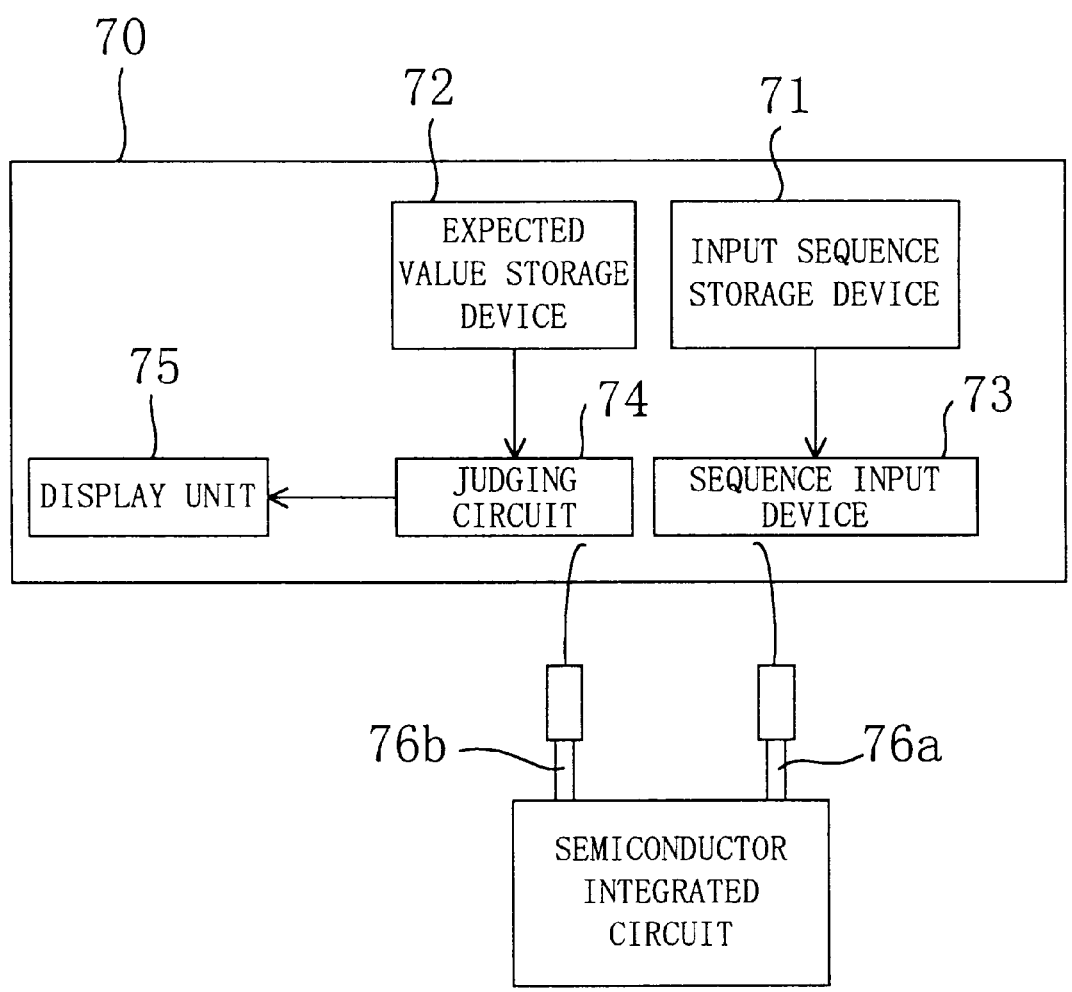
FIG. 14 outlines in block form an organization of a test device of the third embodiment.

FIG. 14 is a block diagram which outlines the organization of a test device for testing logic circuit group 43. Tester 70 has input sequence storage device 71 for storing an input sequence, and expected value storage device 72 for storing an expected value corresponding to said input sequence. With sequence input device 73, signals are applied, via probe 76a on the input side, at external input pins A, B, C, D (see FIG. 6) of logic circuit 43 of the semiconductor integrated circuit device by a sequence (for example, the Table 3 sequence) conforming to the contents of storage in input sequence storage device 71. Further, judging circuit 75 makes a comparison between the logic value of an output signal provided from the external output pin OUT via probe 76b on the output side and the expected value (logic value) stored in the expected value storage device 72. If these values agree, judging circuit 75 makes a judgement of acceptance. On the other hand, if they disagree, judging circuit 75 makes a judgement of rejection. The judgement result is displayed by displaying device 75.

The present embodiment has been described in terms of an MT-CMOS semiconductor integrated circuit including a plurality of logic blocks formed of MT-CMOS semiconductor devices. The present invention may be embodied in an MT-CMOS semiconductor integrated circuit including a single logic block formed of MT-CMOS semiconductor devices.

Further, in accordance with the present embodiment, the state control unit is arranged outside the logic blocks. The state control unit may be arranged in each logic block. In such a case, the same effects are obtained.

Further, in accordance with the present embodiment, the state control signal is applied to the state control unit from outside the semiconductor integrated circuit. An organization for generating state control signals within an internal logic circuit can provide the same effects if a sequence which sets a test-target logic circuit group to go into the operation state is added in step ST33.

FOURTH EMBODIMENT

Figure 10:
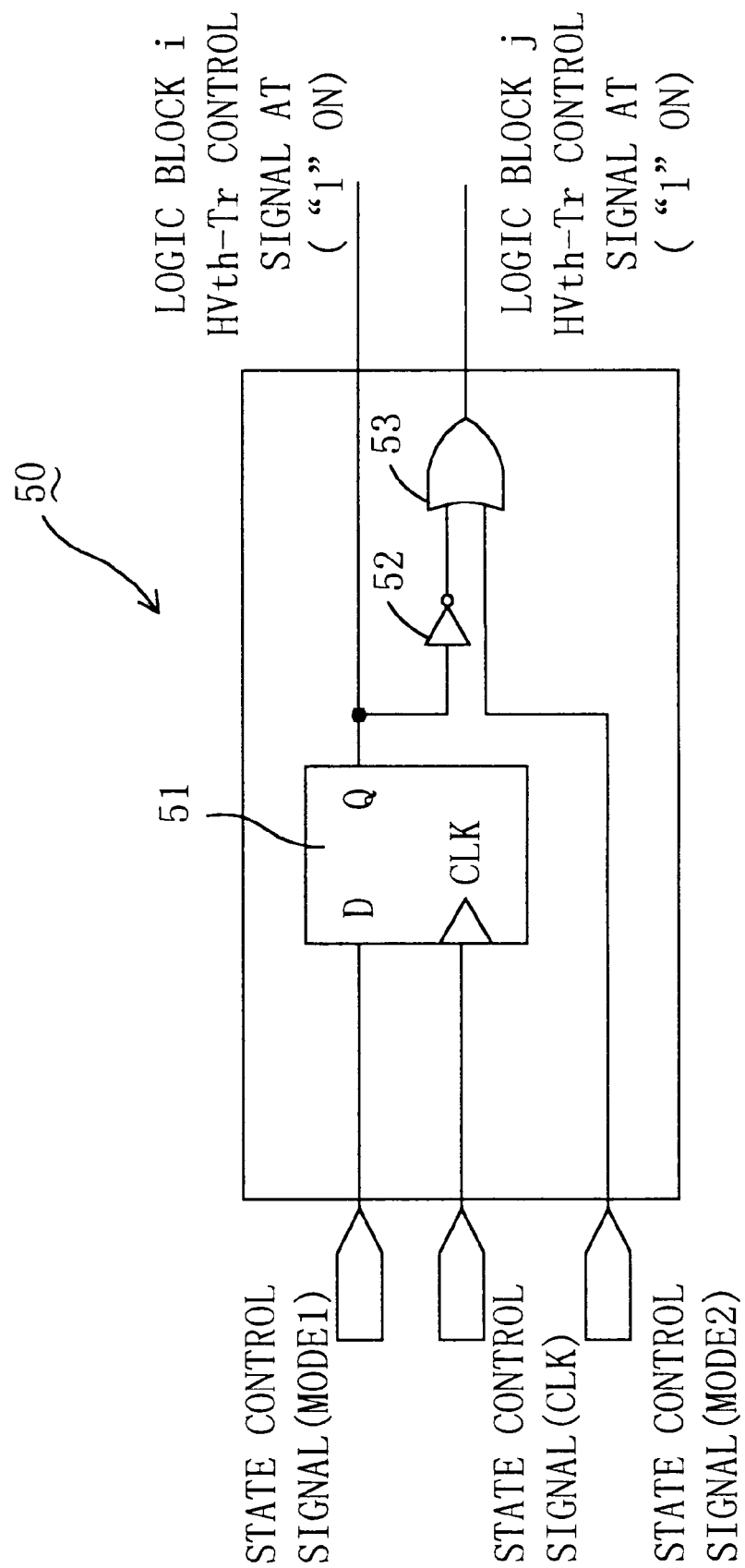
FIG. 10 shows in block form an organization of a state control unit in an MT-CMOS semiconductor integrated circuit in accordance with a fourth embodiment of the present invention.

A fourth embodiment of the present invention is described. The present embodiment relates to a case in which the state control unit is formed of a sequential circuit and provides a plurality of output signals. FIG. 10 is a logic circuit diagram showing the organization of state control unit 50 in accordance with the present embodiment. This state control unit 50 may be applicable to, for example, the FIG. 4 MT-CMOS semiconductor integrated circuit, in other words state control unit 50 finds applications in cases where a control signal is fed to HVth-Tr's of each logic block. However, for the sake of simplification, it is assumed in the present embodiment that logic circuit group 43 of FIG. 7 is placed in logic blocks i and j.

As shown in FIG. 10, state control unit 50 has flip-flop 51, inverter 52, and OR circuit 53. The Q output from flip-flop 51 is controlled to be at "1" using the state control signal MODE1 and the clock signal CLK, as a result of which the HVth-Tr control signal with respect to logic block i becomes "1" and the output from inverter 52 becomes "0". When the state control signal MODE2 becomes "0", the output from OR circuit 53 becomes "1". In this way, all the HVth-Tr's of logic blocks i and j in which the logic circuit group is arranged, are controlled to go into the ON state. It is arranged such that the normal control signal is applied, not through elements (flip-flop 51, inverter 52 and OR circuit 53) but through state control unit 50, to logic circuit group 43.

Table 4 shows a test sequence for the present MT-CMOS semiconductor integrated circuit.

TABLE 4

| A | B | C | D | OUT | MODE1 | MODE2 | CLK |
|---|---|---|---|-----|-------|-------|-----|
| x | x | x | x | x   | 1     | x     | 0   |
| x | x | x | x | x   | 1     | x     | 1   |
| 1 | 0 | 0 | 1 | x   | x     | 1     | 0   |
| 1 | 1 | 0 | 1 | H   | x     | 1     | 0   |

Figure 9:
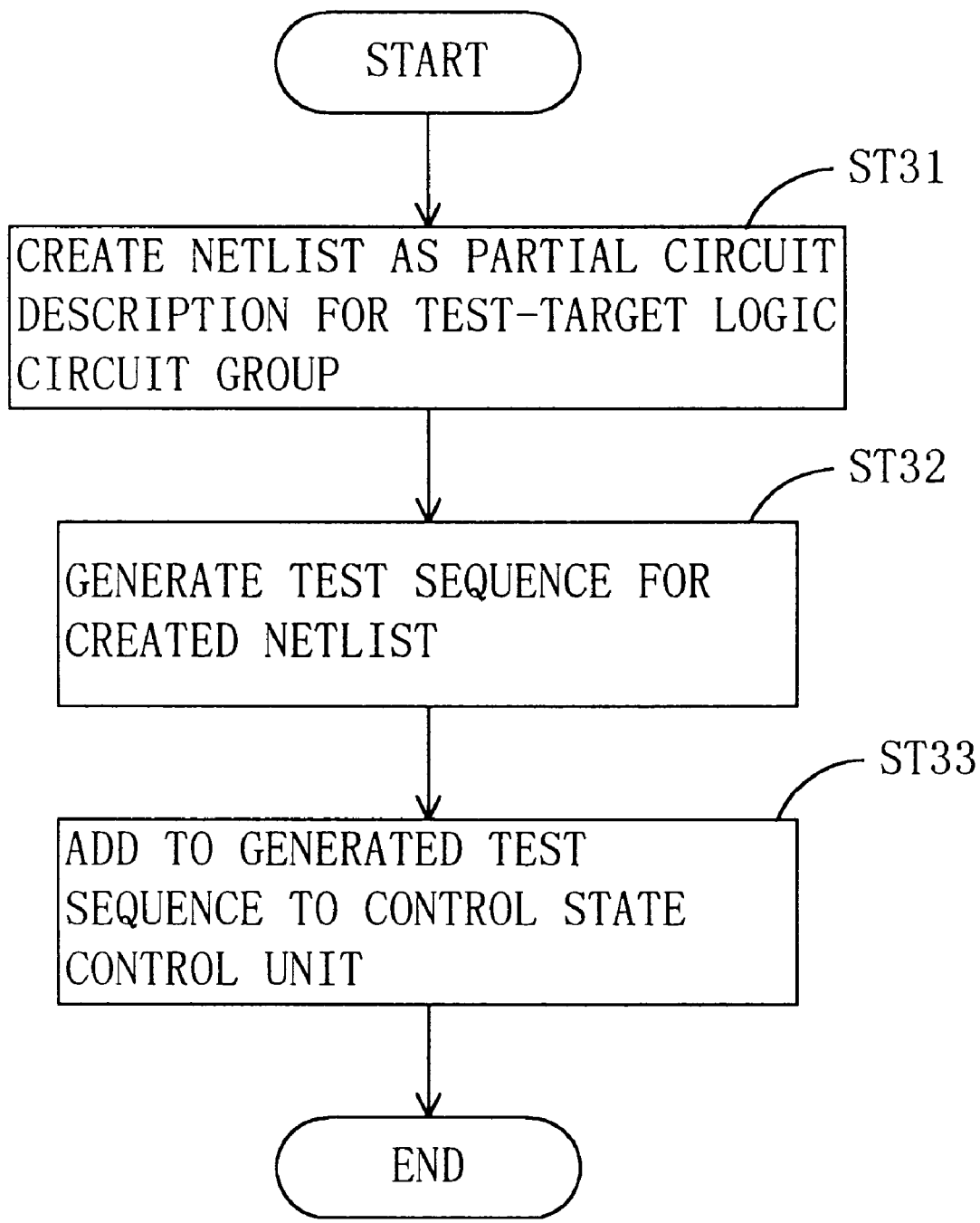
FIG. 9 is a flow chart showing a test procedure of the third embodiment.

In the same procedure as shown by the FIG. 9 flow chart of the third embodiment, a netlist is created (step ST31) and a test sequence for the created netlist is generated (step ST32). The test sequence generated by a conventional technique is a portion from "A" up to "OUT" of the lower two rows of Table 4 (see Table 1). In step ST33, sequences of MODE1, MODE2 and CLK are added thereby making it possible to control all the HVth-Tr's of the logic blocks, in which the logic circuit group is arranged, to turn on, and the operation of the logic circuit group can be tested. Tester 70 of FIG. 14 may be employed as a test device.

Even in cases where the state control unit is formed of a sequential circuit and the state control unit provides a plurality of output signals, a conventional technique can be used by the provision of a state in the state control unit for obtaining output capable of supplying power to all logic blocks in which a target logic circuit group is arranged.

In the present embodiment, each logic block i and j is a single logic block. However, the present test sequence generation method can be embodied in an organization in which the HVth-Tr control signal is provided to each logic block group formed of a plurality of logic blocks.

Further, in accordance with the present embodiment, the state control unit is arranged outside the logic blocks. The state control unit may be arranged in each logic block. This provides the same effects.

Further, in accordance with the present embodiment, the state control signal is applied to the state control unit from outside the semiconductor integrated circuit. An organization of generating the state control signal in an internal logic circuit can provide the same effects by adding a sequence which sets a logic circuit group, a target of testing, to go into the operation state.

FIFTH EMBODIMENT

Figure 11:
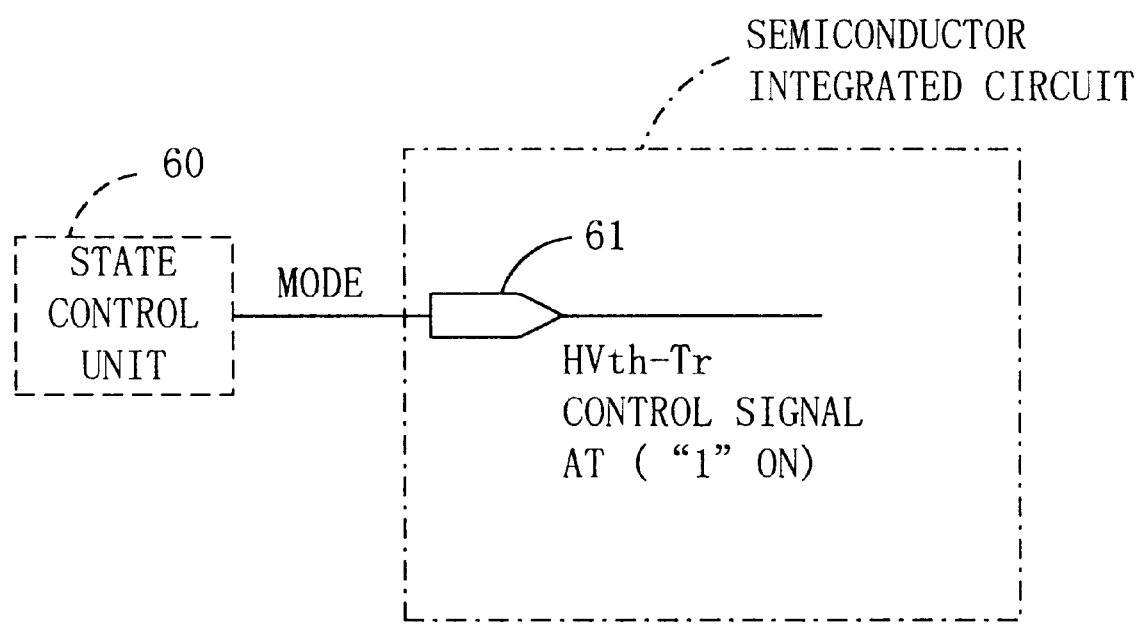
FIG. 11 shows in block form an organization of a state control unit in an MT-CMOS semiconductor integrated circuit in accordance with a fifth embodiment of the present invention.

A fifth embodiment of the present invention is now described in which the state control unit is not placed in the semiconductor integrated circuit and the HVth-Tr control signal is fed directly from outside the circuit. FIG. 11 is a block diagram showing a state control unit to and a signal input unit in the semiconductor integrated circuit according to the fifth embodiment.

Referring to FIG. 11, state control unit 60 of the present embodiment is provided in an external apparatus such as a tester and the semiconductor integrated circuit has only input pin 61, in the present embodiment. The state control signal MODE from state control unit 60 is provided intact from the semiconductor integrated circuit as an HVth-Tr control signal.

Table 5 shows a test sequence of the present embodiment.

TABLE 5

| A | B | C | D | OUT | MODE |
|---|---|---|---|-----|------|
| 1 | 0 | 0 | 1 | X   | 1    |
| 1 | 1 | 0 | 1 | H   | 1    |

Table 5 shows that the test sequence is generated in the same procedure as in the third embodiment (see FIG. 9). Also in the present embodiment, tester 70 shown in FIG. 14 may be employed.

Even in cases where the state control unit contains therein no logic elements and the state control signal is applied from the outside, a test sequence for the MT-CMOS integrated circuit can be generated by adding the state control signal MODE for controlling HVth-Tr's to a test sequence generated by a conventional method.

The present embodiment has been described in terms of an MT-CMOS semiconductor integrated circuit including a plurality of logic blocks formed of MT-CMOS semiconductor devices. The present invention may be embodied in an MT-CMOS semiconductor integrated circuit including a single logic block formed of MT-CMOS semiconductor devices.

Further, the state control unit may be placed outside the semiconductor chip (the semiconductor integrated circuit) in each of the first to fourth embodiments of the present invention.

SIXTH EMBODIMENT

A sixth embodiment of the present invention is described. The present embodiment relates to a method for generating a test sequence for a semiconductor integrated circuit. In the semiconductor integrated circuit, a high-threshold transistor for testing and another high-threshold transistor for normal control are connected between each logic circuit and the power supply terminal and between each logic circuit and the grounding terminal, respectively.

Figure 12:
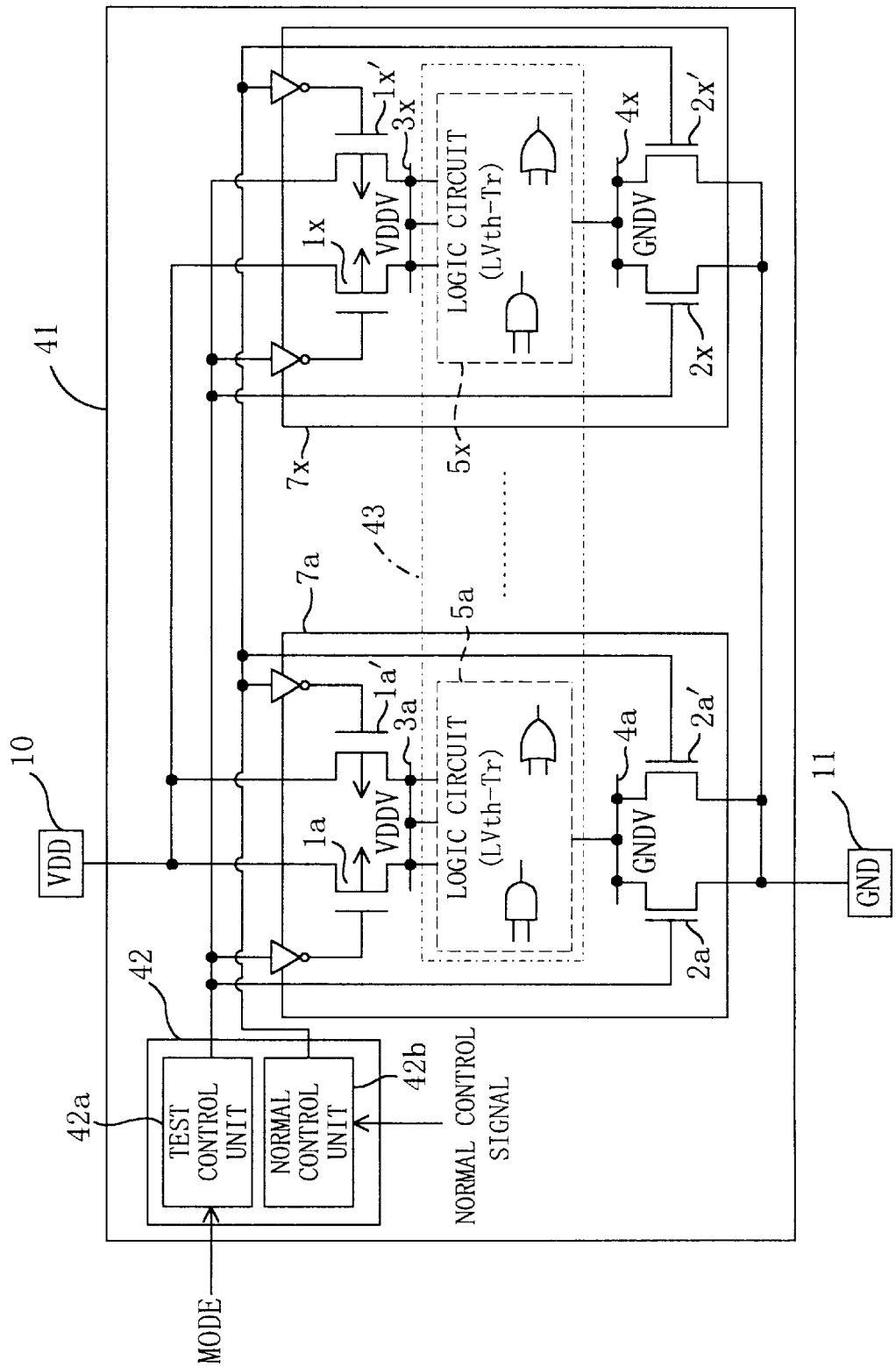
FIG. 12 is an electric circuit diagram of an MT-CMOS semiconductor integrated circuit in accidence with a sixth embodiment of the present invention.
Figure 13:
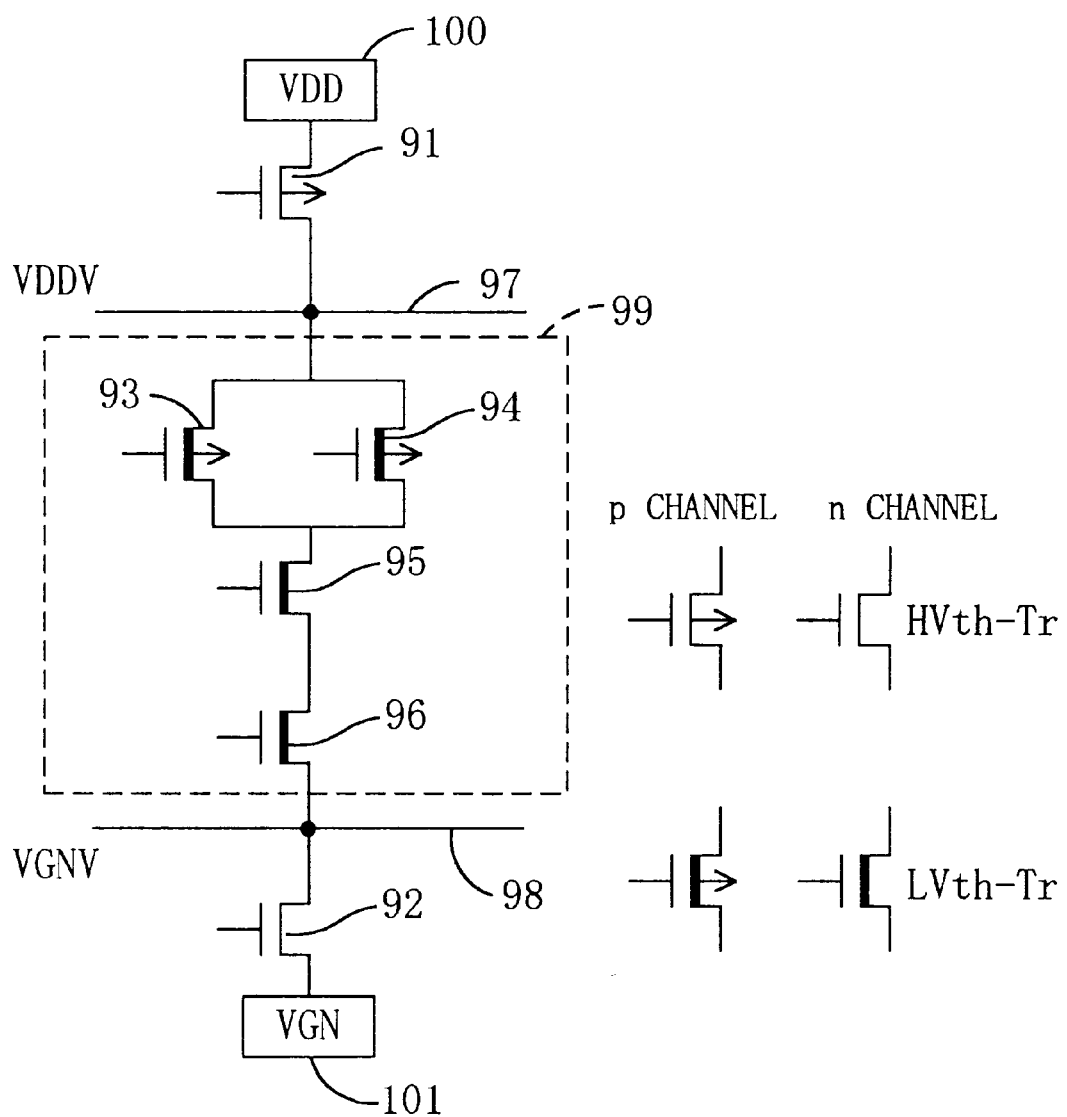
FIG. 13 is an electric circuit diagram illustrating a typical organization of an MT-CMOS semiconductor integrated circuit in accordance with a conventional technique.

FIG. 12 is an electric circuit diagram showing an organization of MT-CMOS semiconductor integrated circuit 41 of the present embodiment.

As can be seen from FIG. 12, the present semiconductor integrated circuit 41 is basically identical in organization with the third embodiment's semiconductor integrated circuit 41 shown in FIG. 6 except that pHVth-Tr's 1a'–1x' and nHVth-Tr's 2a'–2x' for normal control are provided for each logic block 7a–7x in addition to pHVth-Tr's 1a–1x and nHVth-Tr's 2a–2x for testing. The pHVth-Tr (1a–1x) and the pHVth-Tr (1a'–1x') are connected in parallel between the virtual power supply terminal (3a–3x) of the logic circuit (5a–5x) and the power supply terminal 10, while on the other hand the nHVth-Tr (2a–2x) and the nHVth-Tr (2a'–2x') are connected in parallel between the virtual grounding terminal (4a–4x) of the logic circuit (5a–5x) and the grounding terminal 11. Test control unit 42a of state control unit 42 controls, based on the test signal MODE, the ON/OFF state of pHVth-Tr's 1a–1x and nHVth-Tr's 2a–2x, while on the other hand normal control unit 42b of state control unit 42 controls, based on the normal signal, the ON/OFF state of pHVth-Tr's 1a'–1x' and nHVth-Tr's 2a'–2x'.

Logic circuit group 43, composed of logic circuits 5a–5x, may have an organization such as one shown in FIG. 7. It becomes possible to test for a failure occurring in logic circuit group 43 by placing pHVth-Tr's 1a–1x and nHVth-Tr's 2a–2x into the ON state, and to generate test sequences, as in the third embodiment. Also in the present embodiment, tester 70 shown in FIG. 14 may be employed.

The present embodiment is able to achieve the same effects that the third embodiment does.

Also in each of the third to fifth embodiments, HVth-Tr's for testing and HVth-Tr's for normal control may be provided in parallel between the power supply terminal (the grounding terminal) and each logic circuit.

The invention claimed is:

1. A semiconductor circuit system having, on the inside or outside of a semiconductor integrated circuit of said semiconductor circuit system, test command means for issuing a command to perform testing for determining whether said semiconductor integrated circuit is accepted or rejected,
said semiconductor integrated circuit comprising:
   (a) a first terminal which supplies a voltage at high potential;
   (b) a second terminal which supplies a voltage at low potential;
   (c) at least one logic circuit which is connected between said first terminal and said second terminal and which is formed by a placement of a plurality of low-threshold voltage transistors;
   (d) a high-threshold voltage transistor which is connected between at least one of said first and second terminals and said logic circuit and which switches between the ON state and the OFF state thereby to have said logic circuit switched between the operating state and the standby state;
   (e) wiring which is arranged outside said logic circuit to establish connections among said first terminal, said second terminal, said logic circuit, and said high-threshold voltage transistor; and
   (f) a state control unit which receives a test command from said test command means to control the ON/OFF state of said high-threshold voltage transistor according to the type of said received test command.

2. A semiconductor circuit system according to claim 1 wherein, at the time of receiving from said test command means a test command to perform testing of said wiring and said high-threshold voltage transistor, said state control unit controls said high-threshold voltage transistor to go into the OFF state.

3. A semiconductor circuit system according to claim 2, wherein:
   (a) a plurality of said logic circuits are provided;
   (b) said first and second terminals are made common to all of said logic circuits; and
   (c) said state control unit controls said high-threshold voltage transistors coupled to all of said logic circuits to go into the OFF state.

4. A semiconductor circuit system according to claim 2, wherein:
   (a) a plurality of said logic circuits are provided;
   (b) said first and second terminals are made common for every one or more logic circuits of said logic circuits; and
   (c) at the time of receiving from said test command means a test command to perform testing of said wiring and said high-threshold voltage transistors, said state control unit controls said high-threshold voltage transistors, which are coupled to said logic circuits connected between said first terminal and said second terminals, to go into the OFF state.

5. A semiconductor circuit system according to claim 2 wherein said high-threshold transistor is connected between said first terminal and said logic circuit and between said second terminal and said logic circuit.

6. A semiconductor circuit system according to claim 2 further comprising:
   (a) electric current detecting means for detecting the value of an electric current which flows between said first terminal and said second terminal;
   (b) storage means for pre-storing a set value which is referred to at the time of making a judgement of acceptance or rejection as to said detected electric current value;
   (c) judging means, coupled to said electric current detecting means and to said storage means, for making a judgement of rejection when said detected electric current value exceeds said set value, and for making a judgement of acceptance when said detected electric current value is less than said set value; and
   (d) display means for displaying a result of said judgement made by said judging means.

7. A semiconductor circuit system according to claim 1 wherein, when said state control unit receives from said test command means a test command to perform testing of the inside of said logic circuits, said state control unit controls a high-threshold voltage transistor, coupled to a logic circuit of said logic circuits that is a target of testing, to go into the ON state.

8. A semiconductor circuit system according to claim 7 further comprising:
   (a) means for applying a test signal to said logic circuit;
   (b) expected value storing means for pre-storing an expected value for a logic value which is provided when said logic circuit is accepted, with respect to said test signal;

(c) judging means, coupled to said expected value storing means, for making a comparison between the logic value of an output signal from said logic circuit and said expected value, for making a judgement of acceptance when said logic value and said expected value agree, and for making a judgement of rejection when said values disagree; and (d) displaying means for displaying a result of said judgement.

9. A method for testing a semiconductor integrated circuit comprising a first terminal for supplying a voltage at high potential, a second terminal for supplying a voltage at low potential, at least one logic circuit connected between said first terminal and second terminal and formed by a placement of a plurality of low-threshold voltage transistors, a high-threshold voltage transistor which is connected between at least one of said first and second terminals and said logic circuit and which switches between the ON state and the OFF state thereby to have said logic circuit switched between the operating state and the standby state, and wiring which is arranged outside said logic circuit to establish connections among said first terminal, said second terminal, said logic circuit, and said high-threshold voltage transistor;

said method comprising:

(a) a first step of placing said high-threshold voltage transistor into the OFF state;

(b) a second step of detecting the value of an electric current flowing between said first terminal and said second terminal; and (c) a third step of making a judgement of rejection when said detected value exceeds a predetermined set value and of making a judgement of acceptance when said detected value is less than said predetermined set value.

10. A method of testing a semiconductor integrated circuit according to claim 9, wherein:

(a) a plurality of said logic circuits are provided;

(b) said first and second terminals are made common to all of said logic circuits; and (c) in said second step said high-threshold voltage transistors coupled to all of said logic circuits are placed in the OFF state.

11. A method of testing a semiconductor integrated circuit according to claim 9, wherein:

(a) a plurality of said logic circuits are provided;

(b) said first and second terminals are made common for every one or more logic circuits of said logic circuits; and (c) in said second step said high-threshold voltage transistors, which are coupled to said logic circuits connected between said first terminal and said second terminal, are placed in the OFF state.

12. A method of generating a test sequence for a semiconductor integrated circuit comprising a first terminal for supplying a voltage at high potential, a second terminal for supplying a voltage at low potential, at least one logic circuit connected between said first terminal and second terminal and formed by a placement of many elements including a plurality of low-threshold voltage transistors, a high-threshold voltage transistor which is connected between at least one of said first and second terminals and said logic circuit and which switches between the ON state and the OFF state thereby to have said logic circuit switched between the operating state and the standby state, wiring which is arranged outside said logic circuit to establish connections among said first terminal, said second terminal, said logic circuit, and said high-threshold voltage transistor, and a state control unit which provides a control signal to control the ON/OFF state of said high-threshold voltage transistor;

said method comprising:

(a) a first step of creating a partial circuit description about the state of connections among elements of a logic circuit of said logic circuits that is a target of testing;

(b) a second step of creating a test sequence composed of a description as to an input/output relationship for determining whether said test-target logic circuit operates normally on the basis of said partial circuit description created in said first step; and (c) a third step of creating a new sequence capable of placing said control signal from said state control unit in such a mode that said high-threshold voltage transistor which is coupled to said test-target logic circuit can enter the ON state, and adding said new sequence to said test sequence created in said second step.

13. A method of generating a test sequence for a semiconductor integrated circuit according to claim 12, wherein:

(a) a plurality of said high-threshold voltage transistors are connected in parallel between at least one of said first and second terminals and said logic circuit;

(b) a part of said high-threshold voltage transistors are high-threshold voltage transistors for testing; and (c) said third step creates a new sequence capable of placing said control signal from said state control unit in such a mode that only said high-threshold voltage transistors for testing can enter the ON state.

14. A method of generating a test sequence for a semiconductor integrated circuit according to claim 12, wherein:

(a) said high-threshold transistor coupled to said test-target logic circuit is formed so as to go into the ON state according to a control signal applied from outside at the time of testing said logic circuit; and (b) in said third step a new sequence capable of placing said external control signal in such a mode that said test-target logic circuit can enter the operable state is created and said new sequence is added to said test sequence created in said second step.

* * * * *